United States Patent
Singh et al.

(10) Patent No.: US 11,462,527 B2
(45) Date of Patent: Oct. 4, 2022

(54) MICRO-TRENCHING MOLD INTERFACE IN A POP PACKAGE

(71) Applicant: Intel Corporation, Santa Clara, CA (US)

(72) Inventors: Kumar Abhishek Singh, Phoenix, AZ (US); Zhaozhi Li, Chandler, AZ (US); Thomas J. Debonis, Tempe, AZ (US); Robert Nickerson, Chandler, AZ (US); Rees Winters, Glendale, AZ (US)

(73) Assignee: Intel Corporation, Santa Clara, CA (US)

( * ) Notice: Subject to any disclaimer, the term of this patent is extended or adjusted under 35 U.S.C. 154(b) by 908 days.

(21) Appl. No.: 16/049,696

(22) Filed: Jul. 30, 2018

(65) Prior Publication Data

US 2020/0035658 A1   Jan. 30, 2020

(51) Int. Cl.
  *H01L 23/48*   (2006.01)
  *H01L 25/18*   (2006.01)
  *H01L 23/31*   (2006.01)
  *H01L 21/56*   (2006.01)
  *H01L 21/48*   (2006.01)
  *H01L 23/544*  (2006.01)
  *H01L 25/00*   (2006.01)

(52) U.S. Cl.
  CPC ............ *H01L 25/18* (2013.01); *H01L 21/481* (2013.01); *H01L 21/4853* (2013.01); *H01L 21/56* (2013.01); *H01L 23/3185* (2013.01); *H01L 23/544* (2013.01); *H01L 25/50* (2013.01); *H01L 2223/54426* (2013.01)

(58) Field of Classification Search
  CPC ... H01L 23/28; H01L 23/3185; H01L 23/544; H01L 2924/181; H01L 2223/54426
  USPC .......................................................... 257/774
  See application file for complete search history.

(56) References Cited

U.S. PATENT DOCUMENTS

| | | | |
|---|---|---|---|
| 7,977,163 B1* | 7/2011 | Huemoeller | H01L 24/19 438/125 |
| 8,378,476 B2* | 2/2013 | Lee | H01L 23/5389 257/737 |
| 8,669,140 B1* | 3/2014 | Muniandy | H01L 25/50 438/455 |
| 8,829,686 B2* | 9/2014 | Hong | H01L 25/105 257/777 |
| 9,029,998 B2* | 5/2015 | Jang | H01L 23/3128 257/686 |
| 2015/0101502 A1* | 4/2015 | Stowe | B41F 7/00 101/453 |
| 2016/0247790 A1* | 8/2016 | Huang | H01L 23/3128 |

* cited by examiner

*Primary Examiner* — Nitin Parekh
(74) *Attorney, Agent, or Firm* — Schwabe, Williamson & Wyatt, P.C.

(57) ABSTRACT

Embodiments disclosed herein include an electronics package. In an embodiment, the electronics package comprises a package substrate and a die on the package substrate. In an embodiment, a mold layer is positioned over the package substrate. In an embodiment, the electronics package further comprises through-mold interconnects through the mold layer, and a trench that extends at least partially into the mold layer.

25 Claims, 13 Drawing Sheets

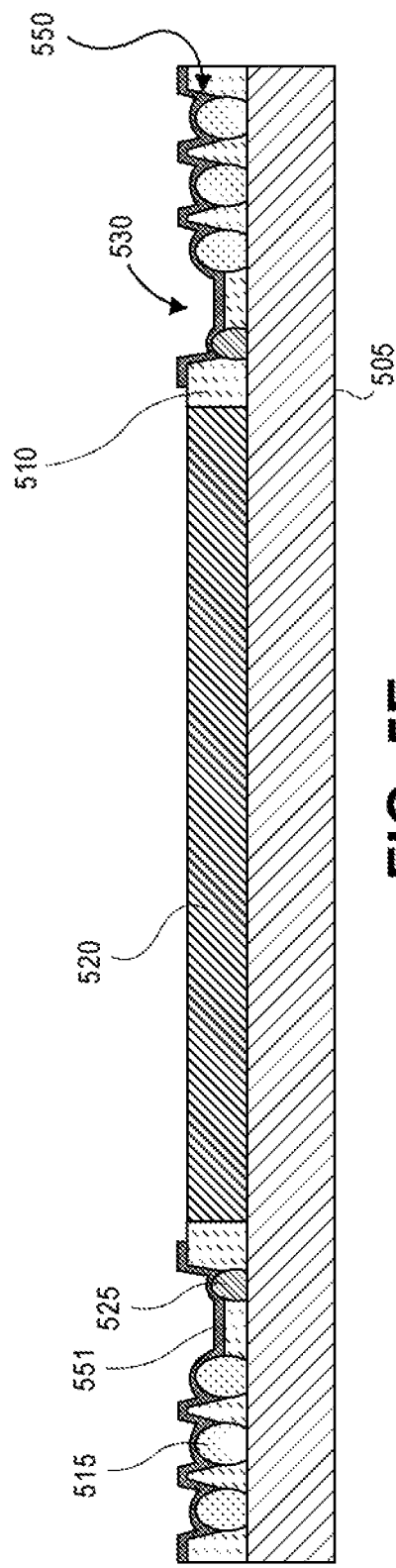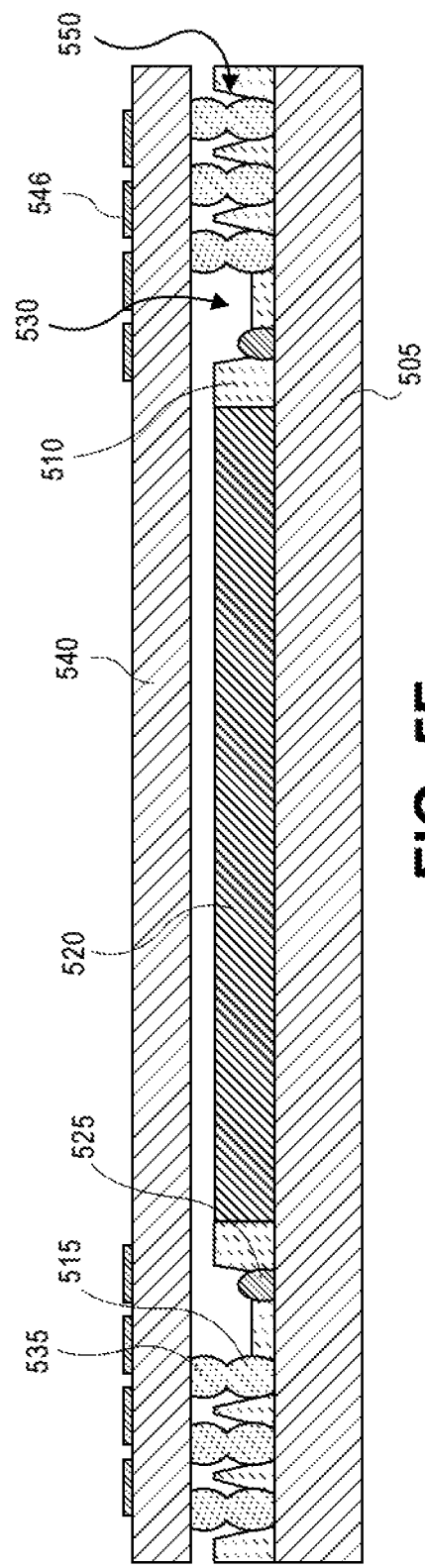

MICRO-TRENCHING MOLD INTERFACE IN A POP PACKAGE

TECHNICAL FIELD

Embodiments of the disclosure are in the field of electronics packaging and, in particular, to package-on-package (PoP) systems with micro-trenches in the mold layer.

BACKGROUND

Package-on-package systems include a first package substrate with a mold layer over the first package substrate. Through-mold interconnects may be formed through the mold layer to provide an electrical connection to a second package substrate positioned over the mold layer. In order to align the second package substrate over the mold layer, fiducials are formed on the first package substrate. However, the fiducials do not appear as uniform marks during alignment. Particularly, flux material deposited on the through-mold interconnects and the fiducials pools around and over the isolated fiducials. As such, the fiducials are not uniformly detectable during alignment processes.

BRIEF DESCRIPTION OF THE DRAWINGS

FIG. 5E is a cross-sectional illustration after a flux material is deposited over the through-mold interconnects, in accordance with an embodiment.

FIG. 5F is a cross-sectional illustration after an interposer is attached to the through-mold interconnects, in accordance with an embodiment.

DESCRIPTION OF THE EMBODIMENTS

Figure 1A:
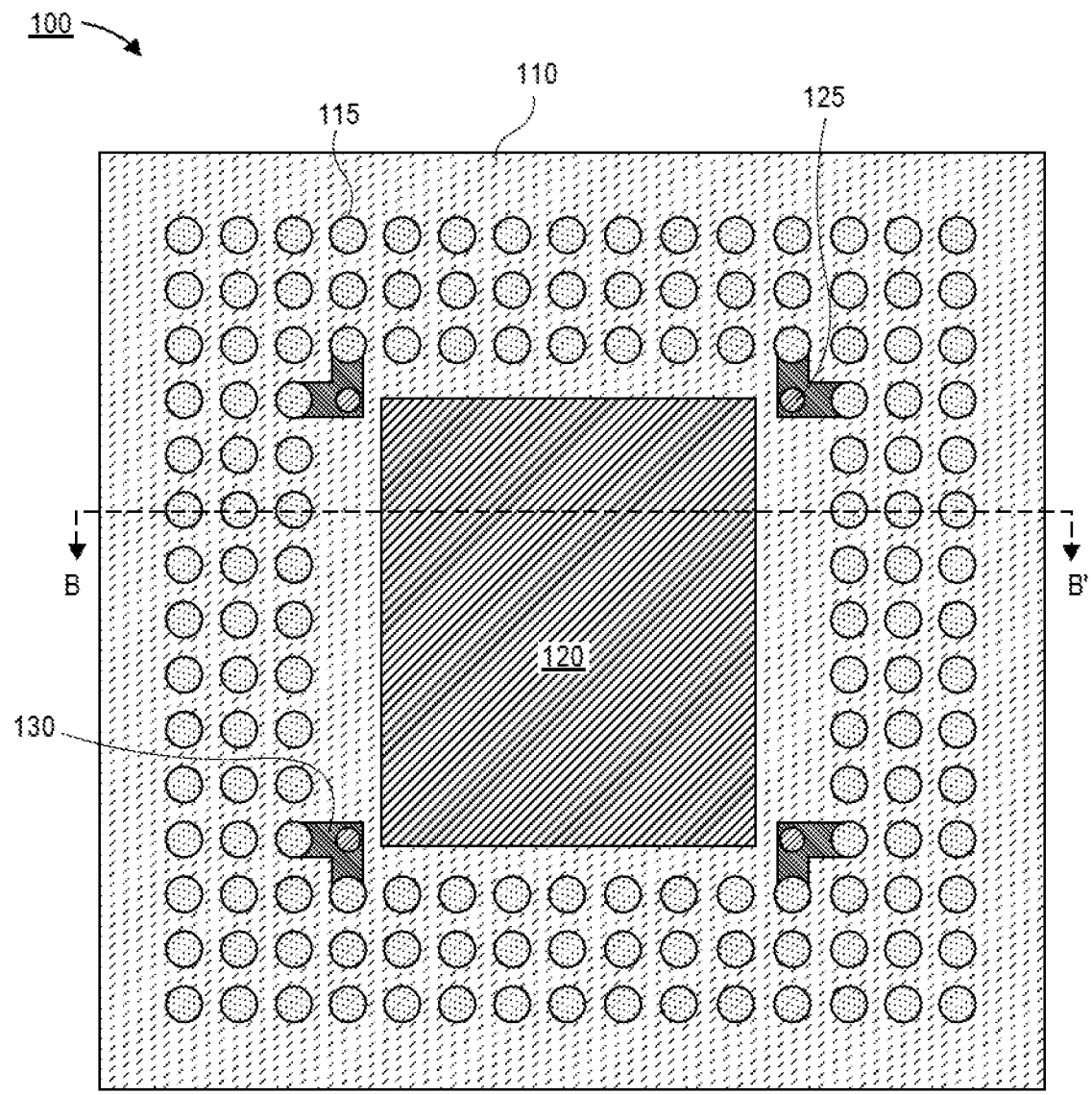
FIG. 1A is a plan view illustration of a package with fiducials fluidically coupled to through-mold interconnects by trenches into the mold layer, in accordance with an embodiment.

Embodiments described herein comprise package-on-package (PoP) systems with trenches in the mold layer and methods of forming such PoP systems. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, currently available PoP packages suffer from inconsistent fiducial marks. Particularly, it is difficult to consistently image the fiducials after flux is deposited. This is because the flux pools around isolated fiducial marks. Accordingly embodiments disclosed herein provide trenches into the mold material that fluidically couples the fiducials to neighboring through-mold interconnects. As such, when flux is deposited, the flux is able to flow away from the fiducial, resulting in a uniform amount of flux around each fiducial. As such, the imaging software used to identify the fiducial is able to function more accurately.

Additionally, embodiments utilize trenches in the mold layer to provide improved flow characteristics of other materials deposited over the mold layer. For example, the flow behavior of viscous material, such as capillary underfill (CUF) materials can be modulated by the presence of trenches in the mold layer. In some embodiments, trenches in the mold layer may also be used as a reservoir for excess material. Accordingly, the use of fluid flow modulating trenches allows for the reduction of gaps or voids between the mold layer and an interposer attached over the mold layer.

Figure 1B:
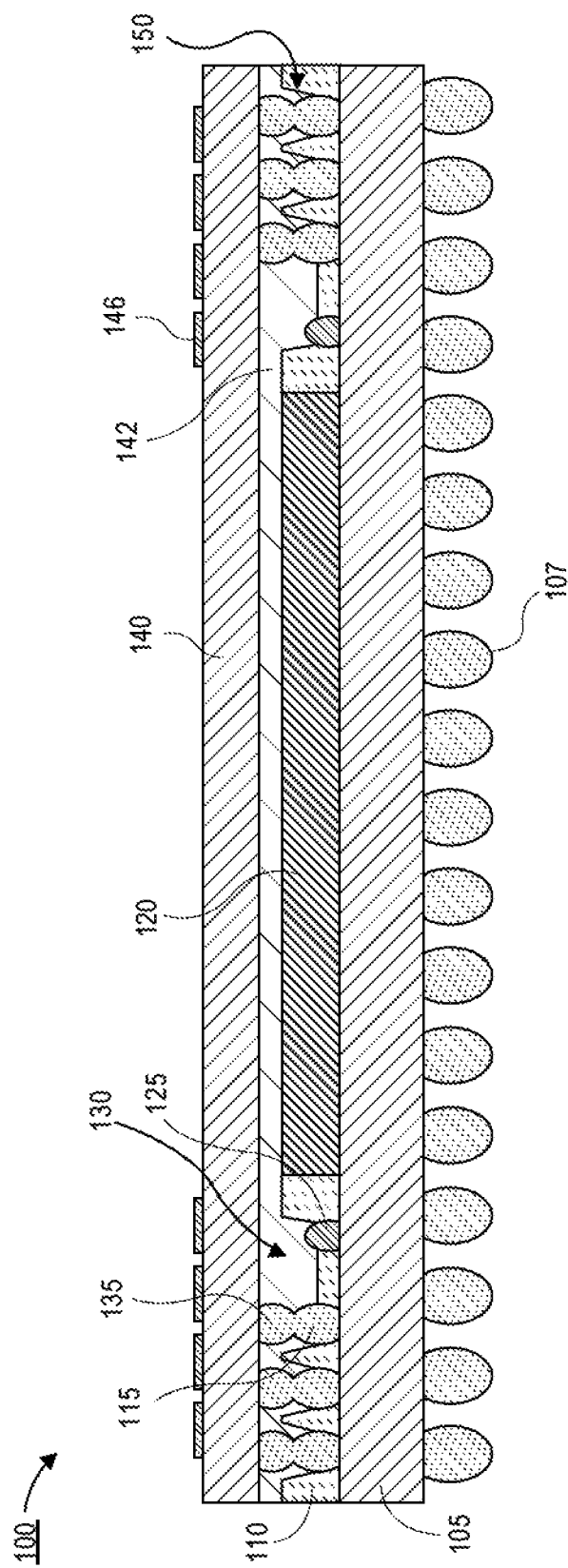
FIG. 1B is a cross-sectional illustration of the package in FIG. 1A along line B-B', in accordance with an embodiment.

Referring now to FIG. 1A and FIG. 1B, a plan view illustration of an electronics package 100 and a corresponding cross-sectional illustration along line B-B' of the electronics package 100 are shown, respectively, in accordance with an embodiment. In an embodiment, the electronics package 100 may comprise a package substrate 105 and a mold layer 110 over the package substrate 105. In an embodiment, the package substrate 105 may comprise alternating layers of conductive traces (not shown) and build-up material, as is known in the art. In an embodiment, conductive traces and vias in the package substrate 105 may electrically couple a top surface of the package substrate 105 to solder balls 107 on a bottom surface of the package substrate 105.

In an embodiment, a die 120 may be attached to the package substrate 105. In an embodiment, the die 120 may be attached to the package substrate 105 with any suitable interconnect, such as a first level interconnect (FLI). For example, the die 120 may be attached to the package substrate 105 with solder balls (not shown) with or without underfill (not shown). In an embodiment, a plurality of through-mold interconnects 115 may be formed through the mold layer 110. In an embodiment, the plurality of through-mold interconnects 115 may surround a perimeter of the die 120. In the illustrated embodiment, the through-mold interconnects 115 are shown as solder bumps. However, embodiments are not limited to such configurations, and the through-mold interconnects 115 may comprise any suitable interconnect architecture, such as copper pillars, copper core solder bumps, any combination of interconnect architectures, or the like.

In an embodiment, an interposer 140 may be attached to the through-mold interconnects 115 with solder bumps 135. In FIG. 1A the solder bumps 135 and the interposer 140 are omitted in order to not obscure various embodiments. In an embodiment, the interposer 140 may comprise alternating layers of conductive traces (not shown) and build-up layers, as is known in the art. In an embodiment, pads 146 may be formed on a top surface of the interposer 140. For example, the pads 146 may be suitable for attaching an additional package (not shown) (e.g., a package that comprises one or more additional dies) or for directly attaching additional dies (not shown). In a particular embodiment, the additional dies may comprise memory dies (e.g., dynamic random access memory (DRAM) dies or the like). In an embodiment, a capillary underfill (CUF) material 142 may be formed between the interposer 140 and the mold layer 110

In an embodiment, one or more fiducials 125 may be formed on the package substrate 105. The fiducials may be alignment marks used during the attachment of the interposer 140 or for any other alignment purpose. In an embodiment, the fiducials 125 may be solder bumps. In a particular embodiment, the fiducials 125 may be a different size solder bump than the through-mold interconnects 115. However, embodiments are not limited to such configurations, and the fiducials 125 may be the same size as the solder bumps of the through-mold interconnects 115.

In an embodiment, the mold layer 110 may comprise a plurality of mold openings 150. The mold openings 150 are omitted from FIG. 1A in order to not obscure embodiments described herein. As shown in FIG. 1B, the mold openings 150 may be formed around the through-mold interconnects 115 and allow for the solder bumps 135 to connect to the through-mold interconnects 115. In the illustrated embodiments, the mold openings 150 are shown as discrete openings around each through-mold interconnect 115. However, it is to be appreciated that in some embodiments, the mold openings 150 may merge together depending on the spacing between the through-mold interconnects 115 and the size of the mold openings 150. In an embodiment, the mold openings 150 may be formed at least partially into the mold layer 150. That is, the mold openings 150 may extend entirely through the mold layer 110 in some embodiments.

In an embodiment, each of the fiducials 125 may be fluidically coupled to one or more of the mold openings 150 with trenches 130. In an embodiment, the trenches 130 may be formed into the mold layer 110. For example, the trenches 130 may be formed partially into the mold layer 110, or the trenches may pass entirely through the mold layer 110. The trenches 130 allow for excess viscous material, such as flux, to flow away from the fiducials 125 in order to prevent pooling of material. That is, embodiments with trenches 130 that fluidically couple the fiducial to a mold opening 150 prevent excess material from being formed over and around the fiducial 125. Accordingly, embodiments allow for uniform and easily recognizable fiducials 125 that may be used by alignment tools for various processing operations.

In an embodiment, the trenches 130 may be formed with any suitable process. In a particular embodiment, the trenches 130 may be formed with the same tool used to form the mold openings 150. For example, the trenches 130 may be formed with a laser. In such embodiments, the sidewalls of the trenches 130 may be non-vertical. As shown in FIG. 1B, the trench 130 has a tapered sidewall. That is, the top of the trench 130 may be wider than a bottom surface of the trench 130.

In FIG. 1A each of the fiducials 125 are shown as being fluidically coupled to two through-mold interconnects 115 by two trenches 130. However, it is to be appreciated that embodiments are not limited to such configurations. For example, FIGS. 1C-1E provide zoomed in plan view illustrations of alternative configurations.

Figure 1C:
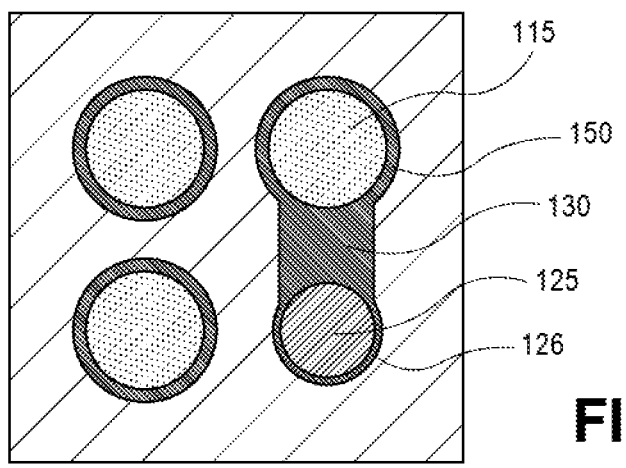
FIG. 1C is a plan view illustration of a fiducial fluidically coupled to a through-mold interconnect with a trench, in accordance with an embodiment.

Referring now to FIG. 1C, a plan view illustration of a fiducial 125 that is fluidically coupled to a single neighboring through-mold interconnect 115 is shown, in accordance with an embodiment. In an embodiment, the through-mold interconnect 115 may be surrounded by a mold opening 150 and the fiducial 125 may be surrounded by a mold opening 126. In an embodiment, the mold opening 126 may be fluidically coupled to mold opening 150 by trench 130. That is, trench 130 may intersect the mold opening 150 around the through-mold interconnect 115 and the mold opening 126 around the fiducial 125.

Figure 1D:
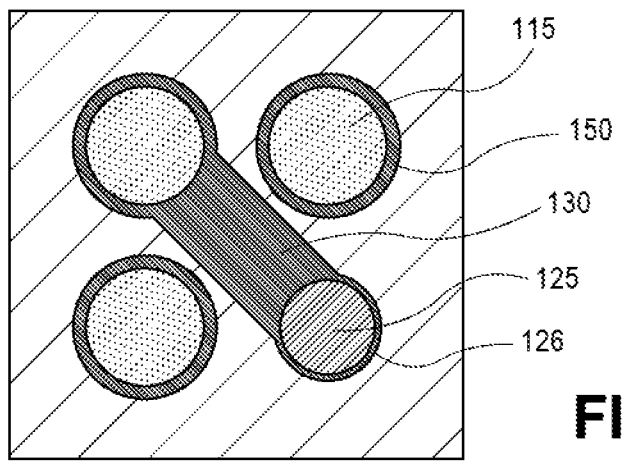
FIG. 1D is a plan view illustration of a fiducial fluidically coupled to a through-mold interconnect with a trench, in accordance with an additional embodiment.

Referring now to FIG. 1D, a plan view illustration of a fiducial 125 that is fluidically coupled to a single neighboring through-mold interconnect 115 is shown, in accordance with an additional embodiment. In the illustrated embodiment, the trench 130 may fluidically couple the fiducial 125 to a through-mold interconnect 115 that is not the nearest neighbor. Accordingly, it is to be appreciated that embodiments include trenches 130 that fluidically couple the fiducial 125 to any other location.

Figure 1E:
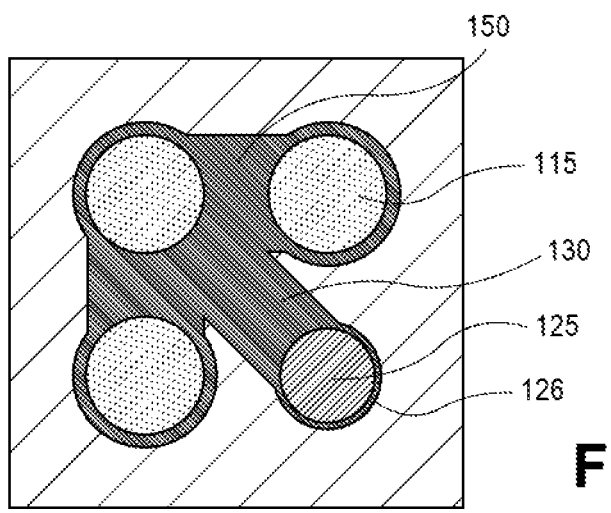
FIG. 1E is a plan view illustration of a fiducial fluidically coupled to a plurality of through-mold interconnects with a trench, in accordance with an embodiment.

Referring now to FIG. 1E, a plan view illustration of a fiducial 125 that is fluidically coupled to a mold opening 150 around a plurality of through-mold interconnects 115 is shown, in accordance with an embodiment. As illustrated, mold openings 150 may surround a plurality of through-mold interconnects 115 to create a larger reservoir. In such embodiments, the trench 130 may couple an opening 126 around the fiducial to a larger mold opening 150 in order to provide enhanced prevention of material pooling around the fiducial 125.

While embodiments disclosed herein are particularly useful for preventing excess material from pooling around the fiducials 125, it is to be appreciated that embodiments are not limited to such applications. For example, the use of trenches 130 into the mold layer 110 may be used to modulate the flow characteristics of other viscous materials (e.g., CUF materials) in order to minimize voids between the interposer 140 and the mold layer 110. Additional embodiments may also include trenches 130 that are used to form reservoirs for excess CUF material. Examples of trenches 130 used for such applications are shown and described with respect to FIGS. 2A-4.

Figure 2A:
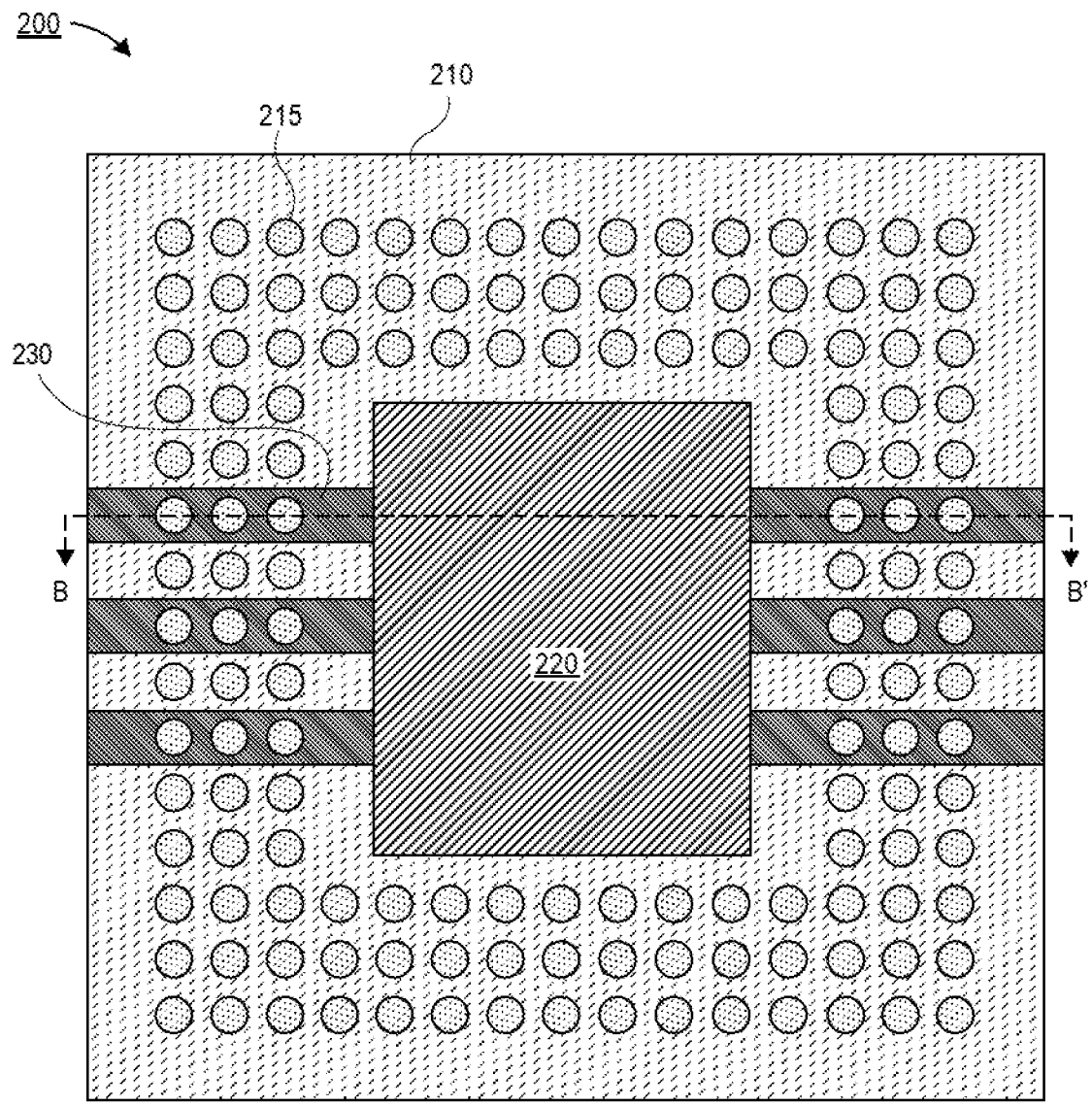
FIG. 2A is a plan view illustration of a package with a plurality of trenches in the mold layer for improved fluid flow, in accordance with an embodiment.
Figure 2B:
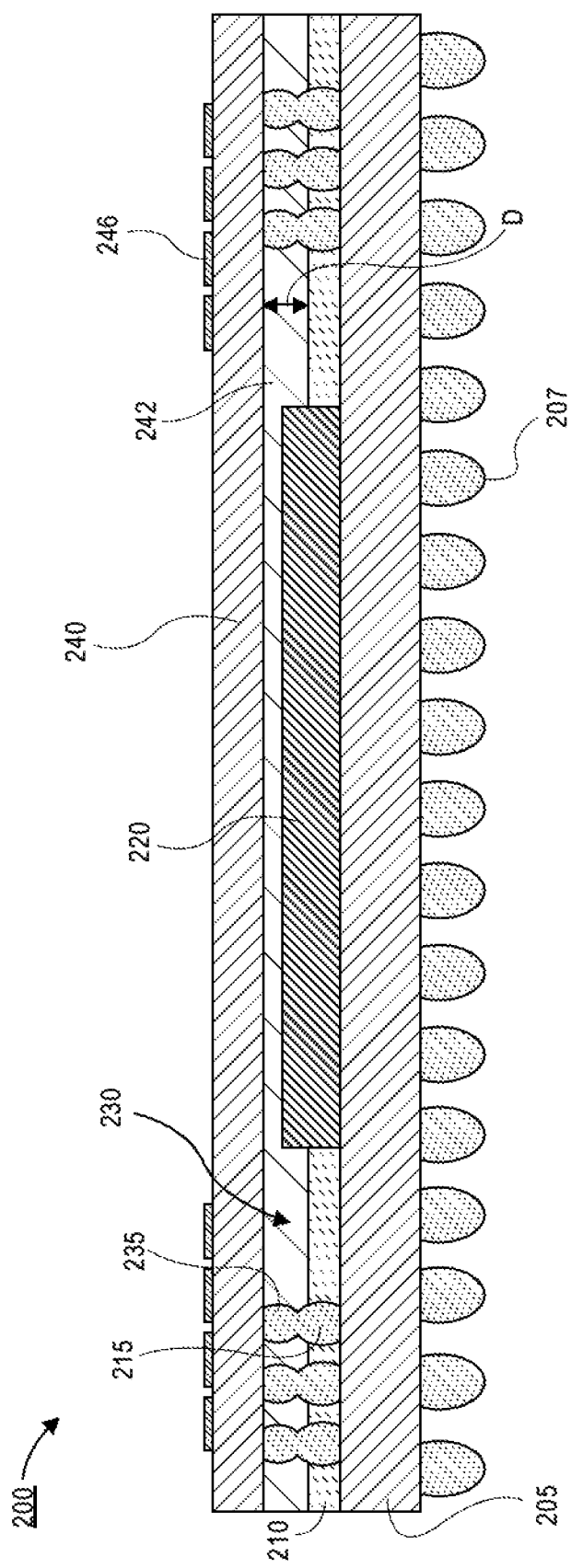
FIG. 2B is a cross-sectional illustration of the package in FIG. 2A along line B-B', in accordance with an embodiment.

Referring now to FIGS. 2A and 2B, a plan view illustration of a package with flow modulating trenches and a cross-sectional illustration along line B-B' are shown, respectively, in accordance with an embodiment. The package 200 illustrated in FIGS. 2A and 2B may be substantially similar to the package 100 described above with respect to FIGS. 1A and 1B, with the exception that the trenches 230 are not limited to fluidically coupling a fiducial to a through-mold interconnect 215. Instead, a plurality of trenches 230 may extend from edges of the mold layer 210 towards the center of the mold layer 210.

In an embodiment, the trenches 230 provide improved fluid flow of materials 242 (e.g., CUF materials) between the interposer 240 and the mold layer 210. Particularly, the trenches 230 increase a distance D between the interposer 240 and the mold layer 210 (compared to regions where there is no trench 230) to provide enhanced fluid flow. The use of such trenches 230 allow for the CUF 242 to proceed towards the center of the package 200 with less resistance. As such, embodiments allow for an improved fill that limits or eliminates the presence of voids between the interposer 240 and the mold layer 210.

In a particular embodiment, the trenches 230 may extend from the edge of the mold layer 210 to a surface of the die 220. However, it is to be appreciated that the trenches 230 do not need to intersect with an edge of the die 220, and they may be any desired length. Furthermore, while each of the trenches 230 are shown as having the same length, embodiments are not limited to such configurations. For example, the trenches 230 may have different lengths. Additionally, while each of the trenches 230 are shown as extending in substantially parallel directions with respect to each other, embodiments are not limited to such configurations. For example, the trenches 230 may extend in non-parallel directions with respect to each other. In yet another embodiment, each of the trenches 230 does not need to maintain a substantially linear path. For example, the trenches 230 may extending along non-linear paths in order to modulate fluid flow in any desired direction. In a particular embodiment, one or more of the trenches 230 may include branches and/or intersect with other trenches 230. In yet another embodiment, the trenches 230 may have a non-uniform depth. For example, the distance D between the interposer and the bottom of the trench 230 may not be uniform between all trenches 230 and/or along the length of a single trench 230.

Figure 3A:
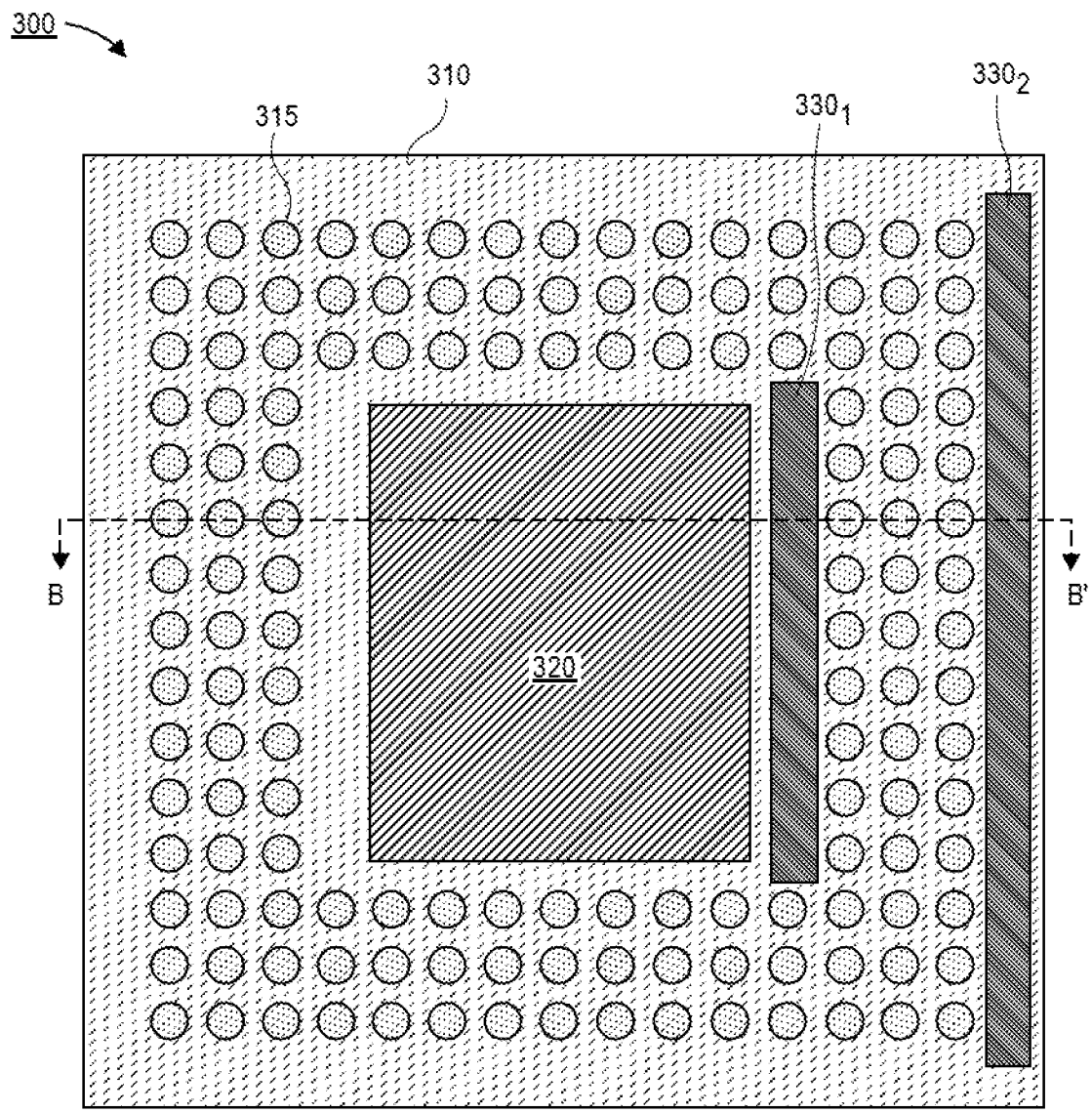
FIG. 3A is a plan view illustration of a package with a plurality of trenches in the mold layer that serve as reservoirs for excess material, in accordance with an embodiment.
Figure 3B:
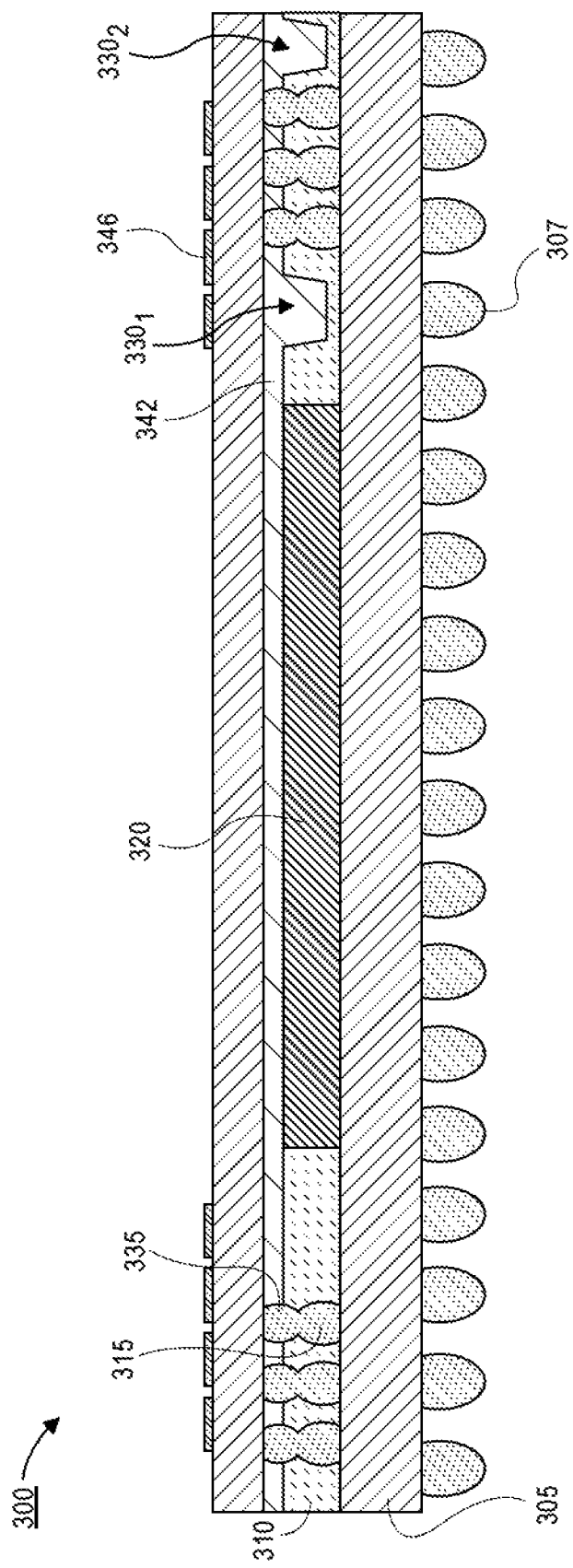
FIG. 3B is a cross-sectional illustration of the package in FIG. 3A along line B-B', in accordance with an embodiment.

Referring now to FIGS. 3A and 3B, a plan view illustration of a package 300 with a plurality of trenches 330 used as reservoirs and a cross-sectional illustration along line B-B' are shown, respectively, in accordance with an embodiment. In an embodiment, the package 300 may comprise one or more trenches 330 that provide areas where excess viscous material 342 (e.g., CUF material) may pool.

In the illustrated embodiment, a first trench $330_1$ is formed between the die 320 and a column of through-mold interconnects 315 and a second trench $330_2$ is formed between a column of through-mold interconnects 315 and an edge of the mold layer 310. However, it is to be appreciated that trenches 330 may be formed in any location depending on the needs of the device. While not illustrated as intersecting any of the through-mold interconnects 315, it is to be appreciated that the trenches 330 may also intersect one or more of the through-mold interconnects 315.

Figure 4:
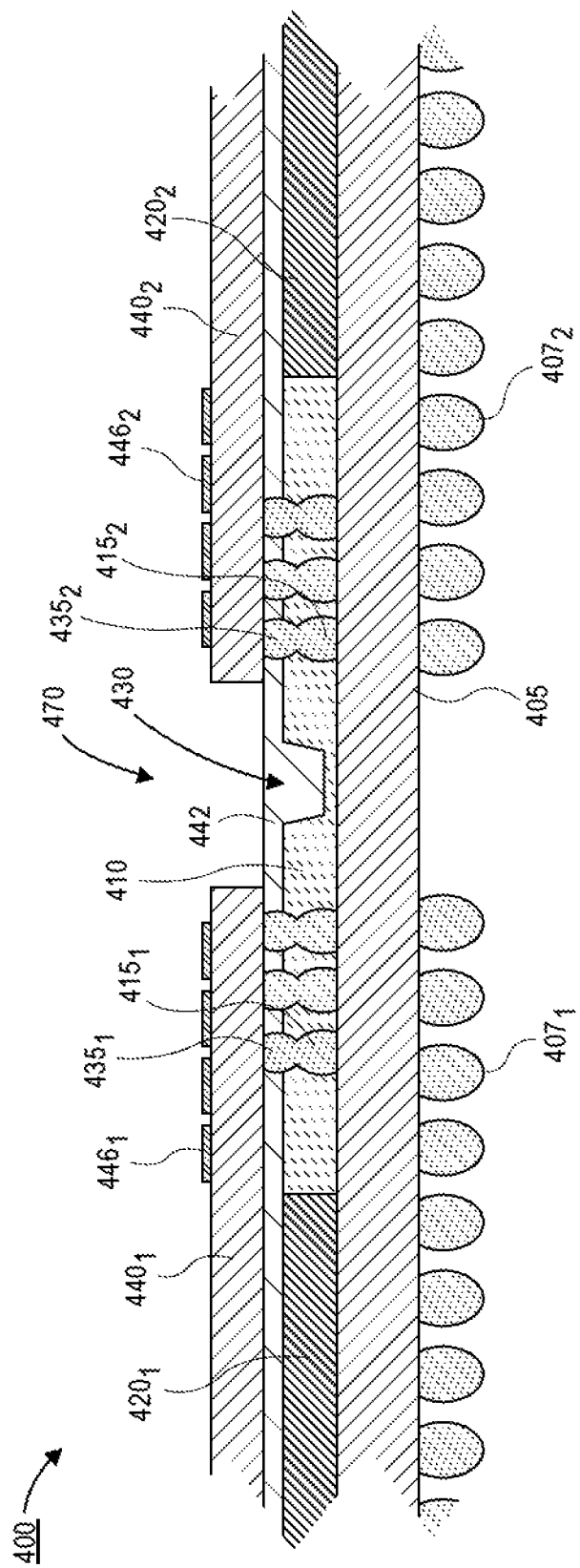
FIG. 4 is a cross-sectional illustration of a trench in the mold layer formed between packages, in accordance with an embodiment.

Referring now to FIG. 4, a cross-sectional illustration of a package 400 is shown prior to dicing, in accordance with an embodiment. In an embodiment, the package 400 may comprise a first die $420_1$, a second die $420_2$, a first interposer $440_1$ and a second interposer $440_2$. Prior to singulation, the first die $420_1$ and the second die $420_2$ may be attached to a single package substrate 405.

In such embodiments, a trench 430 may be formed in the mold layer 410 along a dicing line 470 between packages (e.g., at the panel level, quarter-panel level, or the like). In such an embodiment, the trench 430 may function as reservoir for material 442 (e.g., CUF). In an embodiment, the trench 430 may be removed during the dicing process used to singulate the packages. In some embodiments, a portion of the trench 430 (e.g., a non-vertical sidewall) of the trench may remain along an edge of the singulated package 400. In other embodiments, the dicing process may completely remove the trench 430.

Referring now to FIGS. 5A-5H, a series of cross-sectional illustrations that show a process for forming a package is shown, in accordance with an embodiment. The package formed in the illustrated embodiment may be substantially similar to the package illustrated in FIGS. 1A and 1B. However, it is to be appreciated that packages substantially similar to other embodiments disclosed herein may also be formed using similar process flows, as those skilled in the art will recognize.

Figure 5A:
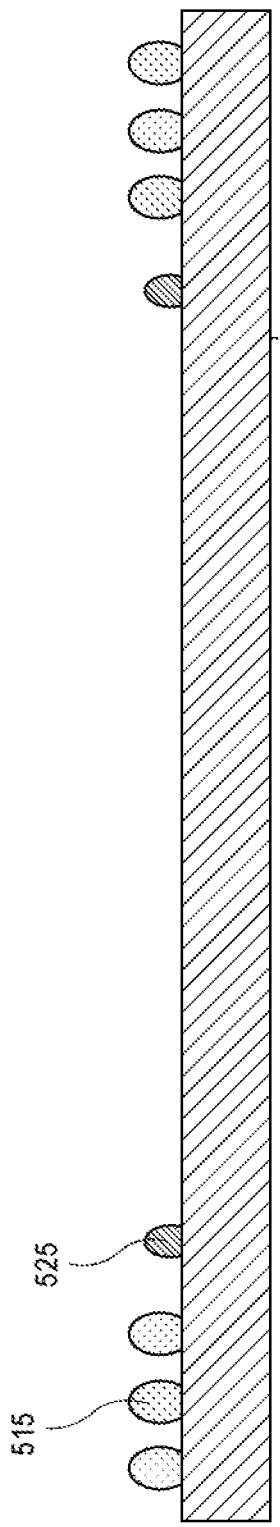
FIG. 5A is a cross-sectional illustration of a package substrate with through-mold interconnects, in accordance with an embodiment.

Referring now to FIG. 5A, a cross-sectional illustration of a package substrate 505 is shown, in accordance with an embodiment. In an embodiment, the package substrate 505 may be any suitable package substrate, such as a package that comprises layers of conductive traces and build-up material. In an embodiment, the package substrate 505 is a coreless package substrate. In other embodiments, the package substrate 505 may be a cored package substrate.

In an embodiment, a plurality of through-mold interconnects 515 are placed on the package substrate 505. While not shown, it is to be appreciated that the through-mold interconnects 515 may be placed over conductive pads that are electrically coupled to traces, vias, etc. in the package substrate 505. In the illustrated embodiment, the through-mold interconnects 515 are shown as being solder balls. However, embodiments are not limited to such configurations, and the through-mold interconnects 515 may comprise conductive pillars, copper core solder balls, combinations of other interconnect architectures, or the like.

In an embodiment, one or more fiducial 525 may also be placed on the package substrate 505. In an embodiment, the fiducials 525 may not be electrically coupled to circuitry of the package substrate 505. That is, in some embodiments, the fiducials 525 may be features that are placed for the sole purpose of providing an alignment mark. However, in other embodiments, the fiducials 525 may also serve as a functioning part of the circuitry of the package. In the illustrated embodiment, the fiducials 525 are shown as being solder bumps. However, it is to be appreciated that the fiducials 525 may be any structure attached to the package substrate 505. In an embodiment, the fiducials 525 may be a different size than the through-mold interconnects 515. In an embodiment, the fiducials 525 may be substantially the same size as the through-mold interconnects 515.

Figure 5B:
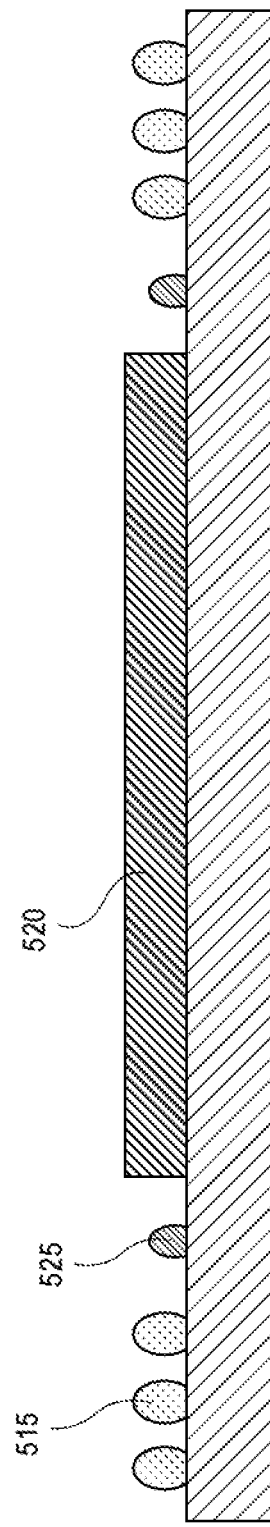
FIG. 5B is a cross-sectional illustration after a die is attached to the package substrate, in accordance with an embodiment.

Referring now to FIG. 5B, a cross-sectional illustration after a die 520 is attached to the package substrate 505 is shown, in accordance with an embodiment. In an embodiment, the die 520 may be attached to the package substrate 505 with any interconnect architecture (not shown). For example, the die 520 may be attached to the package substrate 505 with solder balls, wire bonding, or any other interconnect architecture. In an embodiment, the interconnects may be surrounded by an underfill material (not shown), as is known in the art.

Figure 5C:
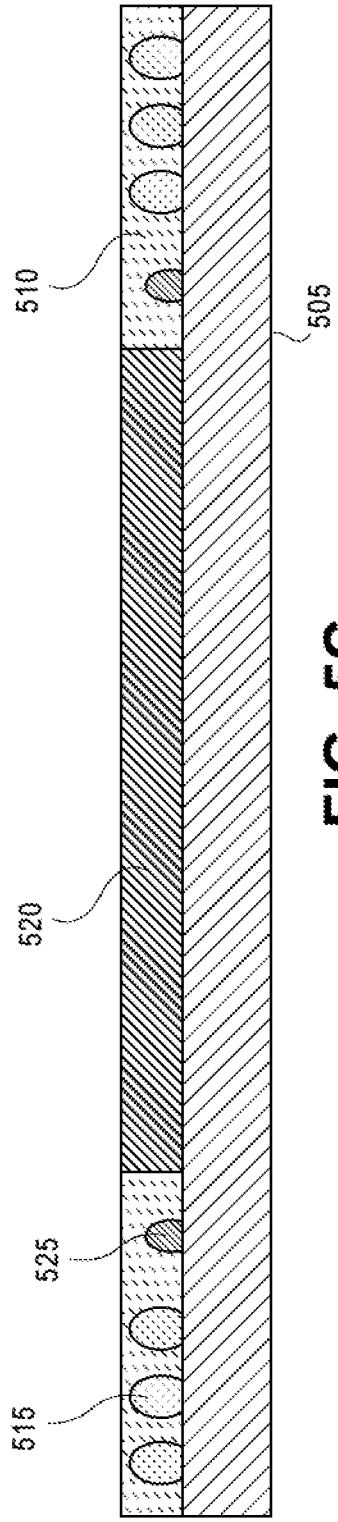
FIG. 5C is a cross-sectional illustration after a mold layer is formed over the through-mold interconnects, in accordance with an embodiment.

Referring now to FIG. 5C, a cross-sectional illustration after a mold layer 510 is disposed over the through-mold interconnects is shown, in accordance with an embodiment. In an embodiment, the mold layer 510 may be any suitable mold material, such as a polymer, an epoxy, or the like. In an embodiment, the mold layer 510 may be disposed over the surface of the die 520 and polished back to expose a backside surface of the die 520. In an embodiment, the through-mold interconnects 515 and the fiducials 525 may be covered by the mold layer 510.

Figure 5D:
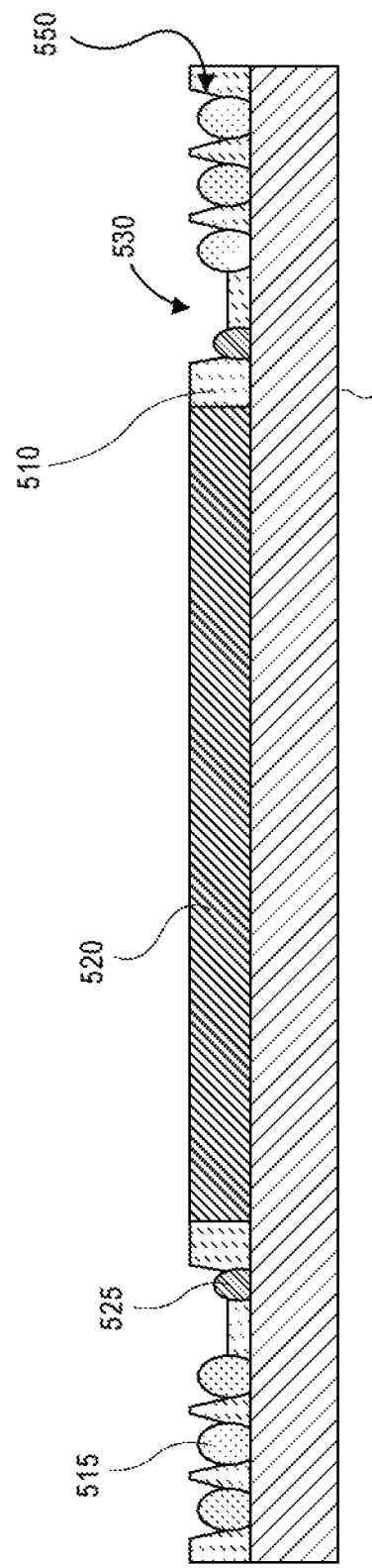
FIG. 5D is a cross-sectional illustration after trenches are formed into the mold layer, in accordance with an embodiment.

Referring now to FIG. 5D, a cross-sectional illustration after the mold layer 510 is patterned is shown, in accordance with an embodiment. In an embodiment, the mold layer 510 may be patterned with any suitable process. For example, the mold layer 510 may be patterned with a laser or the like. The use of a laser may be detected by the profile of the openings. For example, the sidewalls may have a tapered profile that is characteristic of laser drilling.

In an embodiment, the mold layer 510 may be patterned to form openings 550 around the through-mold interconnects 515. The openings 550 may provide access for subsequent solder connections (as will be described in detail below). In an embodiment, patterning the mold layer 510 may also comprise forming one or more trenches 530 into the mold layer 510. In an embodiment, the trenches 530 may be formed into the mold layer 510. For example, the trenches 530 may extend partially into the mold layer 510, or they may pass entirely through the mold layer 510.

In a particular embodiment, trenches 530 may fluidically couple the fiducials 525 to openings 550. Fluidically coupling the fiducials 525 to the openings 550 allows for excess viscous material to flow away from the fiducials 525. Since material is not able to pool around the fiducials 525 alignments tools are able detect and utilize the fiducials more easily. As noted above, trenches 530 may also be used for other purposes, such as described above in accordance with various embodiments. Trenches 530 (e.g., for fluid flow modulation, for reservoirs, or the like) may also be formed into the mold layer at this point in the process flow in accordance with additional embodiments.

Referring now to FIG. 5E, a cross-sectional illustration after a flux 551 is disposed over the package is shown, in accordance with an embodiment. In an embodiment, the flux 551 may comprise any material suitable for improving the soldering of a subsequent material to the through-mold interconnects (e.g., with a reflow process). In an embodiment, the presence of the trenches 530 allow for the flux 551 (or any other viscous material) to flow away from the fiducials 525. Instead of pooling over the fiducials 525, only a thin layer of flux remains over the fiducials 525. As such, subsequent alignment processes may be made with respect to the fiducials 525.

Referring now to FIG. 5F, a cross-sectional illustration after an interposer 540 is attached to the through-mold interconnects 515 is shown, in accordance with an embodiment. In an embodiment, the interposer 540 may be attached to the through-mold interconnects 515 by solder bumps 535 that are reflown to securely attach to the through-mold interconnects 515. In an embodiment, after the reflow, the flux 551 may be removed. In an embodiment, the presence of trenches 530 may also provide pathways for vaporized flux and other vaporized materials to vent from the interior of the package.

Figure 5G:
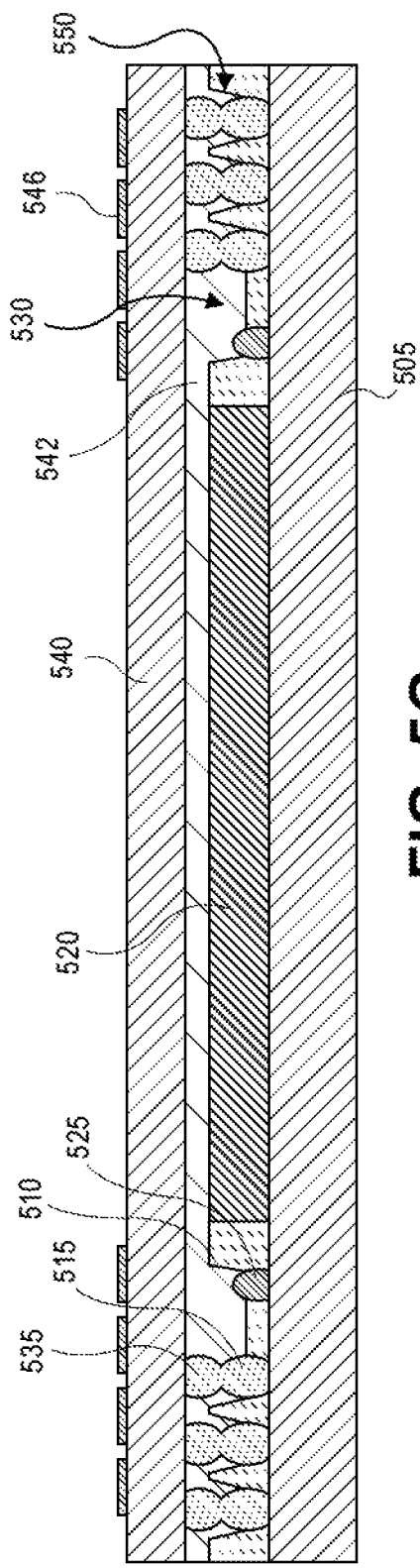
FIG. 5G is a cross-sectional illustration after a capillary underfill material is deposited between the interposer and the mold layer, in accordance with an embodiment.

Referring now to FIG. 5G, a cross-sectional illustration after an underfill material 542 is flown between the interposer 540 and the mold layer 510 is shown, in accordance with an embodiment. In an embodiment, the underfill material 542 may be flown with a capillary underfill process. In some embodiments, the presence of trenches 530 may serve to modulate the flow of the underfill material 542 and/or provide reservoirs where excess underfill material 542 may pool, as described above.

Figure 5H:
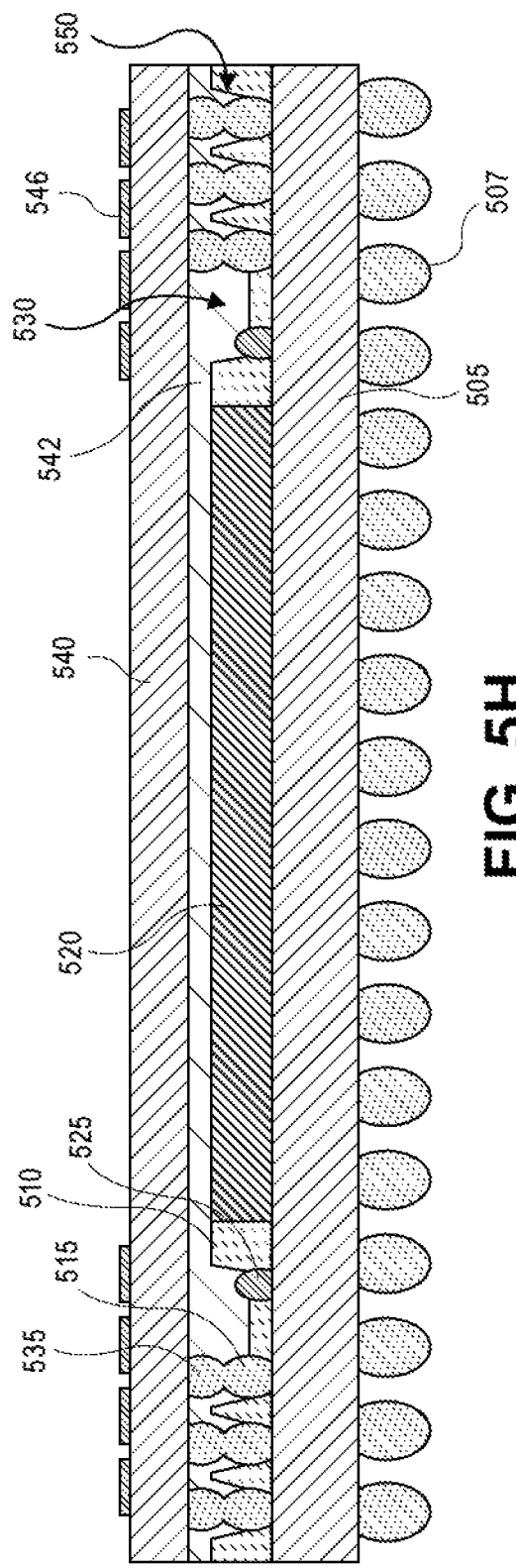
FIG. 5H is a cross-sectional illustration after solder balls are attached to the package substrate, in accordance with an embodiment.

Referring now to FIG. 5H, a cross-sectional illustration after bumps 507 are attached to a surface of the package substrate 505 opposing the mold layer 510 is shown, in accordance with an embodiment. In an embodiment, the package may be mounted to a board (e.g., a printed circuit board (PCB) or the like) with the bumps 507. In an embodiment, one or more additional dies (not shown) may be attached to the interposer 540 on the conductive pads 546. In an embodiment, the additional dies may be memory dies (e.g., DRAM dies) that are communicatively coupled to the first die 520 on the package substrate 505 by the through-mold interconnects 515 and the solder balls 535. In an embodiment, the first die 520 may be a processor or the like. Additionally, while a single die 520 is shown on the package substrate 505, it is to be appreciated that any number of dies 520, silicon bridges, or the like may be coupled to the package substrate 505.

Furthermore, while embodiments above describe specific applications of trenches for use in conjunction with fiducials and modulating flow characteristics of viscous materials, it is to be appreciated that embodiments are not limited to such applications. Embodiments may also include trenches formed in the mold layer for use in flowing other materials. For example, adhesives for attaching additional substrates, interposers, dies, etc. may be delivered to desired locations by flowing along a trench. Additionally, the trenches may also be used for patterning conductive features (e.g., a redistribution layer) into the mold layer. For example, conductive materials may be deposited into the trenches to form traces that redistribute a bump-pattern or the like.

Figure 6:
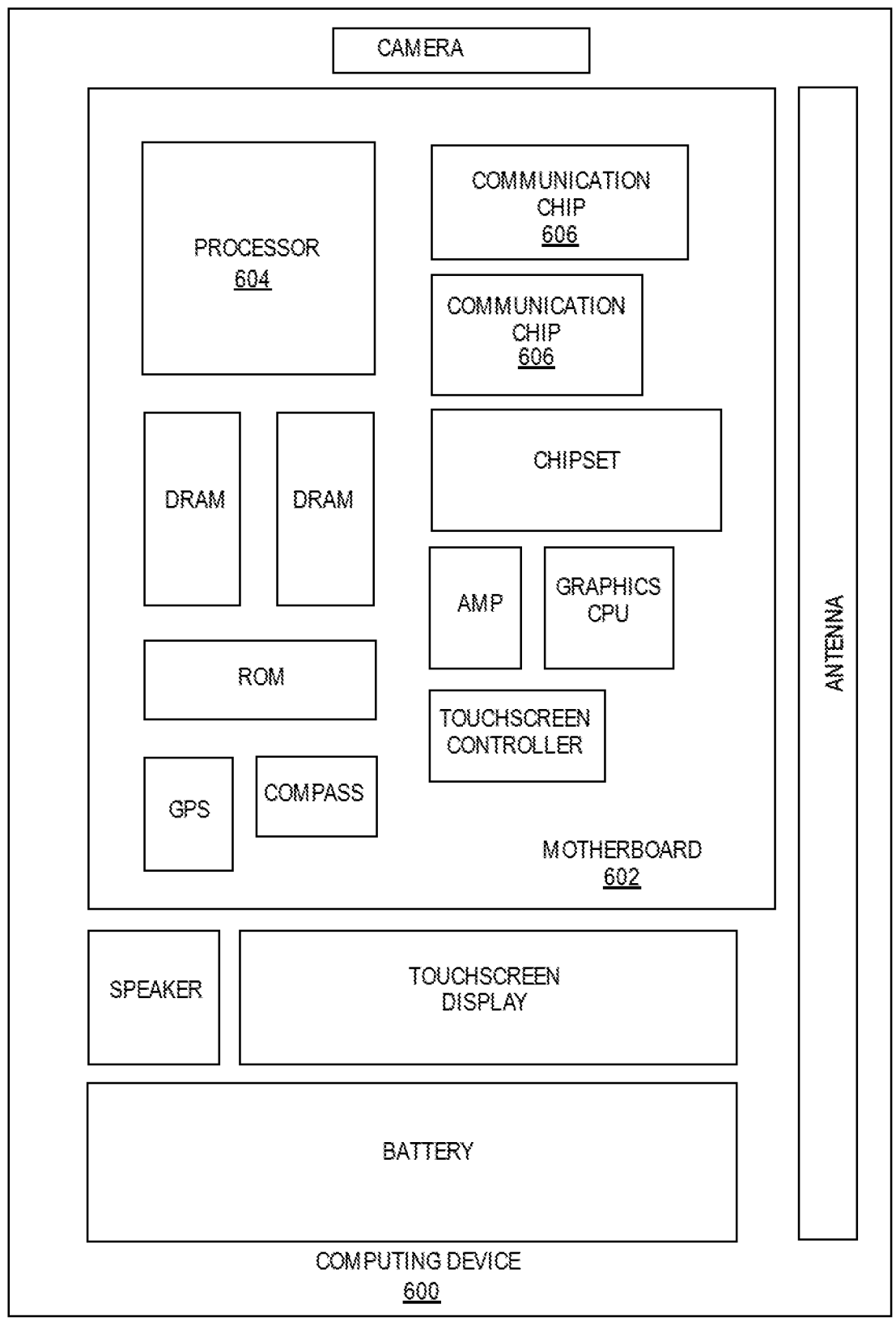
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be communicatively coupled to an organic electronics package that comprises a mold layer over the package, where there is one or more trenches formed into, but not through, the mold layer, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be communicatively coupled to an organic electronics package that comprises a mold layer over the package, where there is one or more trenches formed into, but not through, the mold layer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronics package, comprising: a package substrate; a die on the package substrate; a mold layer over the package substrate; through-mold interconnects through the mold layer; and a trench into the mold layer, wherein the trench extends at least partially into the mold layer.

Example 2: the electronics package of Example 1, further comprising: a fiducial on the package substrate.

Example 3: the electronics package of Example 1 or Example 2, wherein the trench extends from the fiducial to one of the through-mold interconnects.

Example 4: the electronics package of Examples 1-3, further comprising a second trench that extends from the fiducial to a second one of the through-mold interconnects.

Example 5: the electronics package of Examples 1-4, wherein the trench extends from an edge of the mold layer towards the die.

Example 6: the electronics package of Examples 1-5, wherein the trench extends from the edge of the mold layer past a plurality of rows of through-mold interconnects.

Example 7: the electronics package of Examples 1-6, wherein the trench is positioned between the die and a plurality of through-mold interconnects.

Example 8: the electronics package of Examples 1-7, further comprising a second trench positioned between the through-mold interconnects and an edge of the electronics package.

Example 9: the electronics package of Examples 1-8, wherein the trench has non-vertical sidewalls.

Example 10: the electronics package of Examples 1-9, wherein the trench intersects with a through-mold interconnect opening.

Example 11: the electronics package of Examples 1-10, further comprising: an interposer over the mold layer, wherein the interposer is electrically coupled to the through-mold interconnects with solder bumps.

Example 12: the electronics package of Examples 1-11, further comprising: an underfill material between the mold layer and the interposer.

Example 13: the electronics package of Examples 1-12, wherein the fiducial comprises a solder ball, and wherein the solder ball is electrically isolated from the interposer and the die.

Example 14: the electronics package of Examples 1-13, wherein memory dies are electrically coupled to the interposer, and wherein the die is a processor.

Example 15: an electronics package, comprising: a package substrate; a die attached to the package substrate; a mold layer over the package substrate; a plurality of through-mold interconnects through the mold layer and attached to the package substrate, wherein the through-mold interconnects are formed around a perimeter of the die, and wherein each of the through-mold interconnects are surrounded by a mold opening that at least partially extends through the mold layer; a fiducial between the die and the through-mold interconnects; and a trench that at least partially extends through the mold layer, wherein the trench extends from the fiducial towards one of the through-mold interconnects, and wherein the trench intersects the mold opening surrounding the through-mold interconnect.

Example 16: the electronics package of Example 15, further comprising: an interposer over the mold layer, wherein the interposer is electrically coupled to the package substrate by the through-mold interconnects; and an underfill material between the interposer and the mold layer, wherein the underfill material fills the trench.

Example 17: the electronics package of Example 15 or Example 16, further comprising: a second trench.

Example 18: the electronics package of Examples 15-17, wherein the second trench is between the edge of the die and an innermost row of through-mold interconnects.

Example 19: the electronics package of Examples 15-18, wherein the second trench is between an outermost row of through-mold interconnects and an edge of the package substrate.

Example 20: the electronics package of Examples 15-19, further comprising: a second trench, wherein the second trench intersects the edge of the die.

Example 21: the electronics package of Examples 15-20, wherein a second die is attached to the interposer.

Example 22: the electronics package of Examples 15-21, wherein the second die is a memory die, and wherein the first die is a processor.

Example 23: a method of forming an electronics package, comprising: forming through-mold interconnects on a package substrate; forming a plurality of fiducials on the package substrate; attaching a die to the package substrate, wherein the through-mold interconnects surround the die; forming a mold layer over the plurality of fiducials, the through-mold interconnects, and the die; forming mold openings to expose the through-mold interconnects and the fiducials; and forming trenches between the fiducials and the through-mold interconnects.

Example 24: the method of Example 23, wherein the trenches are formed with a laser.

Example 25: the method of Example 23 or Example 24, further comprising: depositing a flux over the through-mold interconnects and the fiducials, wherein the flux flows into the trenches.

What is claimed is:

1. An electronics package, comprising:
a package substrate;
a die on the package substrate;
a mold layer over the package substrate;
through-mold interconnects through the mold layer; and
a trench into the mold layer, wherein the trench extends at least partially into the mold layer, and wherein the trench extends laterally to two or more of the through-mold interconnects.

2. The electronics package of claim 1, further comprising:
a fiducial on the package substrate.

3. The electronics package of claim 2, wherein the trench extends from the fiducial to the one of the through-mold interconnects.

4. The electronics package of claim 3, further comprising a second trench that extends from the fiducial to a second one of the through-mold interconnects.

5. The electronics package of claim 1, wherein the trench extends from an edge of the mold layer towards the die.

6. The electronics package of claim 5, wherein the trench extends from the edge of the mold layer past a plurality of rows of through-mold interconnects.

7. The electronics package of claim 1, wherein the trench is positioned between the die and a plurality of through-mold interconnects.

8. The electronics package of claim 1, further comprising a second trench positioned between the through-mold interconnects and an edge of the electronics package.

9. The electronics package of claim 1, wherein the trench has non-vertical sidewalls.

10. The electronics package of claim 1, wherein the trench intersects with a through-mold interconnect opening.

11. The electronics package of claim 1, further comprising:
an interposer over the mold layer, wherein the interposer is electrically coupled to the through-mold interconnects with solder bumps.

12. The electronics package of claim 11, further comprising:
an underfill material between the mold layer and the interposer.

13. The electronics package of claim 11, further comprising a fiducial on the package substrate, wherein the fiducial comprises a solder ball, and wherein the solder ball is electrically isolated from the interposer and the die.

14. The electronics package of claim 13, wherein memory dies are electrically coupled to the interposer, and wherein the die is a processor.

15. An electronics package, comprising:
a package substrate;
a die attached to the package substrate;
a mold layer over the package substrate;
a plurality of through-mold interconnects through the mold layer and attached to the package substrate, wherein the through-mold interconnects are formed around a perimeter of the die, and wherein each of the through-mold interconnects are surrounded by a mold opening that at least partially extends through the mold layer;
a fiducial between the die and the through-mold interconnects; and
a trench that at least partially extends through the mold layer, wherein the trench extends from the fiducial towards one of the through-mold interconnects, and wherein the trench intersects the mold opening surrounding the through-mold interconnect.

16. The electronics package of claim 15, further comprising:
an interposer over the mold layer, wherein the interposer is electrically coupled to the package substrate by the through-mold interconnects; and
an underfill material between the interposer and the mold layer, wherein the underfill material fills the trench.

17. The electronics package of claim 16, further comprising:
a second trench.

18. The electronics package of claim 17, wherein the second trench is between the edge of the die and an innermost row of through-mold interconnects.

19. The electronics package of claim 17, wherein the second trench is between an outermost row of through-mold interconnects and an edge of the package substrate.

20. The electronics package of claim 16, further comprising:
a second trench, wherein the second trench intersects the edge of the die.

21. The electronics package of claim 16, wherein a second die is attached to the interposer.

22. The electronics package of claim 21, wherein the second die is a memory die, and wherein the first die is a processor.

23. An electronics package, comprising:
a package substrate;
a die on the package substrate;
a mold layer over the package substrate;
through-mold interconnects through the mold layer;
a fiducial on the package substrate
a trench into the mold layer, wherein the trench extends at least partially into the mold layer, and wherein the trench extends to one of the through-mold interconnects, and wherein the trench extends from the fiducial to the one of the through-mold interconnects.

24. The electronics package of claim 23, further comprising a second trench that extends from the fiducial to a second one of the through-mold interconnects.

25. An electronics package, comprising:
a package substrate;
a die on the package substrate;

a mold layer over the package substrate;
through-mold interconnects through the mold layer; and
a trench into the mold layer, wherein the trench extends at least partially into the mold layer, and wherein the trench extends to one of the through-mold interconnects, wherein the trench extends from an edge of the mold layer towards the die, and wherein the trench extends from the edge of the mold layer past a plurality of rows of through-mold interconnects.

* * * * *